(12) United States Patent
Abe et al.

(10) Patent No.: US 10,957,570 B2
(45) Date of Patent: Mar. 23, 2021

(54) ARTICLE STORAGE FACILITY

(71) Applicant: Daifuku Co., Ltd., Osaka (JP)

(72) Inventors: Takeshi Abe, Hinocho (JP); Tadahiro Yoshimoto, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 102 days.

(21) Appl. No.: 16/221,935

(22) Filed: Dec. 17, 2018

(65) Prior Publication Data
US 2019/0198370 A1 Jun. 27, 2019

(30) Foreign Application Priority Data
Dec. 21, 2017 (JP) .............................. JP2017-245292

(51) Int. Cl.
*H01L 21/677* (2006.01)
*B65G 1/04* (2006.01)

(52) U.S. Cl.
CPC .......... *H01L 21/67769* (2013.01); *B65G 1/04* (2013.01); *H01L 21/67766* (2013.01)

(58) Field of Classification Search
CPC ......... H01L 21/67769; H01L 21/67379; H01L 21/6773; H01L 21/67766; H01L 21/67775; H01L 21/67736; H01L 21/67781; B65G 1/04; B65G 1/02; B65G 1/0407; A47B 47/021; A47B 96/061
See application file for complete search history.

(56) References Cited

U.S. PATENT DOCUMENTS

| | | | | |
|---|---|---|---|---|
| 10,703,565 | B2* | 7/2020 | Hayashi | H01L 21/67769 |
| 2001/0038783 | A1* | 11/2001 | Nakashima | H01L 21/67772 414/217 |
| 2003/0099527 | A1* | 5/2003 | Mitsuyoshi | H01L 21/67769 414/217 |
| 2007/0207016 | A1* | 9/2007 | Murata | B65G 1/04 414/281 |
| 2008/0056860 | A1* | 3/2008 | Natume | H01L 21/67769 414/222.01 |
| 2012/0306626 | A1* | 12/2012 | Abe | B65G 1/0435 340/10.4 |
| 2016/0130083 | A1* | 5/2016 | Abe | H01L 21/67775 414/276 |
| 2016/0293468 | A1* | 10/2016 | Morikawa | H01L 21/67769 |
| 2019/0144205 | A1* | 5/2019 | Li | H01L 21/67769 414/279 |

FOREIGN PATENT DOCUMENTS

JP 2008-174335 A 7/2008

* cited by examiner

*Primary Examiner* — Glenn F Myers
(74) *Attorney, Agent, or Firm* — The Webb Law Firm

(57) ABSTRACT

An advancing/retracting mechanism includes a first arm, a second arm, a first coupling part that couples the first arm and the second arm, and a second coupling part that couples a supporting body and the first arm. A transfer device is configured to move the supporting body back and forth with the first coupling part located on a first side relative to the second coupling part, by rotating the first arm and the second arm. In a first region, which is a region in the depth direction and includes an end on the front side of the rack body, a distance from the width directional center to the first supporting portion is longer than a distance from the width directional center to the second supporting portion.

3 Claims, 8 Drawing Sheets

ARTICLE STORAGE FACILITY

CROSS-REFERENCE TO RELATED APPLICATION

This application claims priority to Japanese Patent Application No. 2017-245292 filed Dec. 21, 2017, the disclosure of which is hereby incorporated in its entirety by reference.

TECHNICAL FIELD

The present invention relates to an article storage facility that includes a storage rack that stores articles, and a transfer device that transfers the articles to the storage rack from the front side of the storage rack.

BACKGROUND OF THE INVENTION

One example of an article storage facility as described above is disclosed in JP 2008-174335A (Patent Document 1). A stocker (1) disclosed in Patent Document 1 includes a storage rack (2) on which storage articles (9) are placed, and a stacker device (4) that transfers a storage article (9) to the storage rack (2) from the front side of the storage rack (2). As shown in FIG. 4 and the like of Patent Document 1, the stacker device (4) includes a hand (47) that supports the storage article (9) from below, and a link mechanism (46) that moves the hand (47) back and forth in a depth direction of the storage rack (2). The link mechanism (46) is constituted by a plurality of arms (46a to 46c). The storage article (9) is transferred between the hand (47) and the storage rack (2), as a result of the hand (47) being projected to the back side of the storage rack (2) by the link mechanism (46), and in this state, the hand (47) passing through a notch (2a) formed in the storage rack (2) in a vertical direction.

SUMMARY OF THE INVENTION

Meanwhile, in view of downsizing of the article storage facility in the depth direction and reducing time necessary for transferring an article to the storage rack, it is desirable that the storage rack and the transfer device can be arranged as close as possible to each other in the depth direction. However, as in the configuration of Patent Document 1 in which an advancing/retracting mechanism of the transfer device rotates a plurality of arms rotatably coupled to each other to move back and forth a supporting body that supports the article, a trajectory of movement of the plurality of arms when the supporting body is moved back and forth is likely to be large when viewed in the vertical direction, and it is not easy to arrange the storage rack and the transfer device close to each other in the depth direction while avoiding interference between the storage rack and the transfer device.

Therefore, there is a demand for realizing an article storage facility that uses an advancing/retracting mechanism configured to move back and forth a supporting body that supports an article, by rotating a plurality of arms rotatably coupled to each other, and in which the distance, in a depth direction, between a storage rack and a transfer device can be reduced.

According to the present disclosure, an article storage facility includes: a storage rack configured to store at least one article; and a transfer device configured to transfer an article to the storage rack from a front side of the storage rack; wherein the storage rack includes a rack body configured to support an article from below, assuming that, in a horizontal plane, a direction that is orthogonal to a depth direction of the storage rack is a lateral width direction, and one side in the lateral width direction is a first side, and the other side in the lateral width direction is a second side, the rack body includes, on the first side with respect to a width directional center, a first supporting portion that is formed extending in the depth direction, and, on the second side with respect to the width directional center, a second supporting portion that is formed extending in the depth direction, the width directional center being the center in the lateral width direction of the rack body, and the rack body being able to support, on both sides in the lateral width direction, a plurality of articles aligned in the depth direction using the first supporting portion and the second supporting portion, and the transfer device includes a supporting body configured to support an article from below, and an advancing/retracting mechanism configured to move the supporting body back and forth in the depth direction, an article being transferred between the supporting body and the rack body, by the supporting body being projected toward a back side of the storage rack by the advancing/retracting mechanism, and in this state, the supporting body passing through a separation space formed between the first supporting portion and the second supporting portion in a vertical direction, the advancing/retracting mechanism includes: a first arm; a second arm; a first coupling part that couples the first arm and the second arm so that they can rotate about a first axis that extends in the vertical direction; and a second coupling part that couples the supporting body and the first arm so that they can rotate about a second axis that extends in the vertical direction, the second coupling part being provided at a position in the first arm that is different from a position at which the first coupling part is provided, the transfer device is configured to move the supporting body back and forth with the first coupling part located on the first side relative to the second coupling part, by rotating the first arm and the second arm about the first axis in opposite directions, and in a first region, which is a region in the depth direction and includes an end on the front side of the rack body, a distance from the width directional center to the first supporting portion is longer than a distance from the width directional center to the second supporting portion.

With the above-described configuration, a trajectory of movement of the advancing/retracting mechanism when the supporting body is moved back and forth is a trajectory that protrudes, to the first side, from a trajectory of movement of the supporting body, due to the fact that the first coupling part is located on the first side relative to the second coupling part. In this regard, with the above-described configuration, the rack body is formed such that, in the first region, which is a region in the depth direction and includes an end on the front side of the rack body, a distance from the width directional center, which is the center in the lateral width direction of the rack body, to the first supporting portion (hereinafter, referred to as a "first distance") is longer than a distance from the width directional center to the second supporting portion (hereinafter, referred to as a "second distance"). Accordingly, in the first region, the first distance being longer than the second distance makes it possible to enlarge the separation space formed between the first supporting portion and the second supporting portion toward the first side. Since the separation space can be enlarged to the first side in the first region in this manner, it is easy to arrange the rack body and the transfer device close to each other in the depth direction while avoiding interference between the rack body and the trajectory of movement of the advancing/retracting mechanism, compared to a case where the first distance is equal to the second distance in the first region. As a result, it is possible to realize an article storage facility that uses the advancing/retracting mechanism configured to move back and forth the supporting body that supports an article, by rotating the plurality of arms rotatably coupled to each other, and in which the distance, in the depth direction, between the storage rack and the transfer device can be reduced.

Further features and advantages of the article storage facility will become apparent from the following description of embodiments to be explained with reference to the drawings.

DESCRIPTION OF THE EMBODIMENTS

An embodiment of an article storage facility will be described with reference to the drawings. In the present embodiment, a first distance L1 corresponds to a "distance from the width directional center to a first supporting portion", a second distance L2 corresponds to a "distance from the width directional center to a second supporting portion", a first projected position P1 corresponds to a "specific position", and a first storage place S1 corresponds to a "specific storage place".

Figure 1:
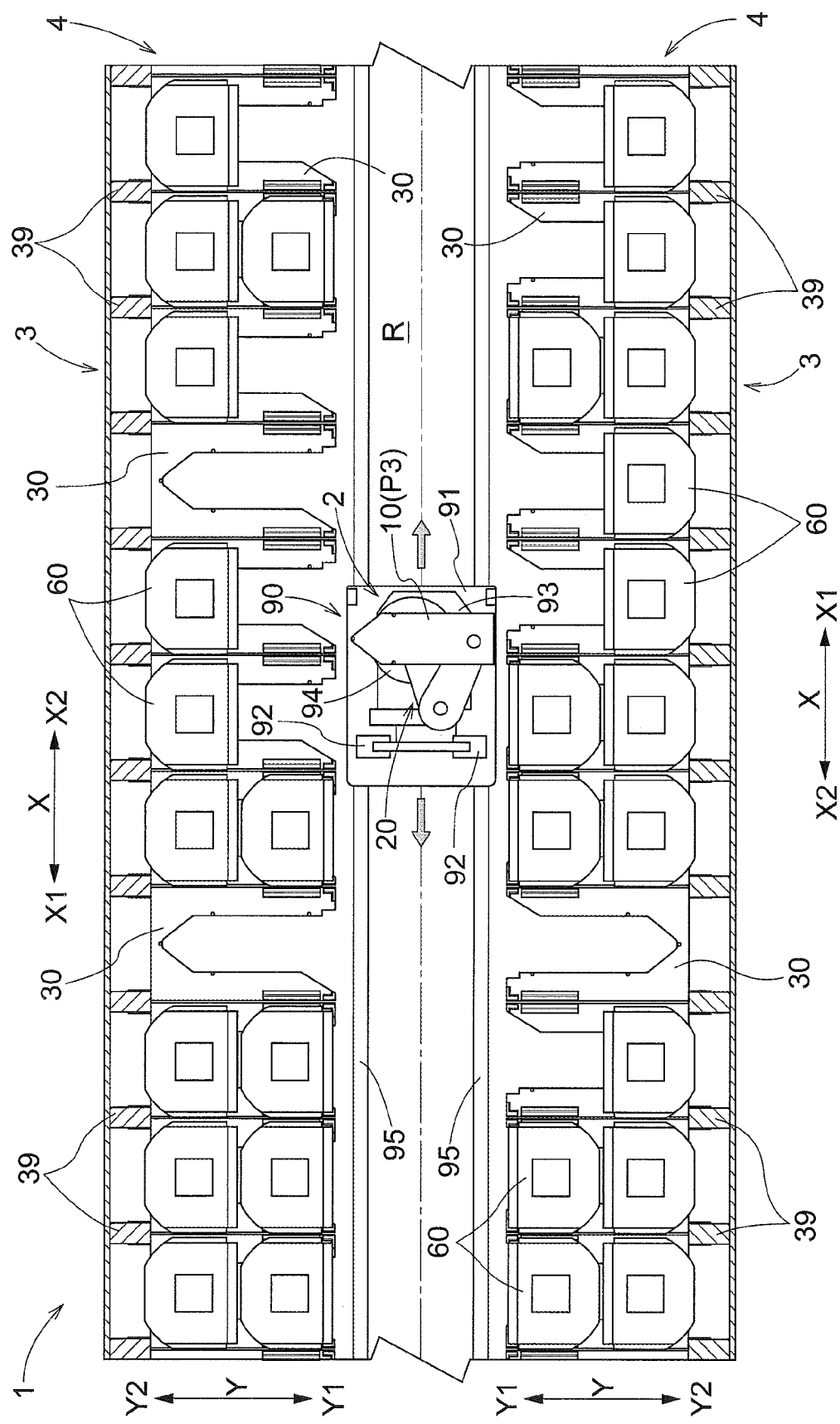
FIG. 1 is a plan view illustrating part of an article storage facility.

As shown in FIG. 1, an article storage facility 1 includes storage racks 3 in which articles 60 are stored, and a transfer device 2 configured to transfer the articles 60 to the storage racks 3 from front sides Y1 of the storage racks 3. The storage racks 3 are provided for articles 60 (storage objects) that each have, at a plurality of positions on the bottom 63 thereof, positioning recesses 70 (see FIG. 3) that are recessed upward. In other words, the articles 60 that have the recesses 70 at a plurality of positions on the bottom 63 thereof are stored in the storage racks 3. The storage racks 3 are provided with rack bodies 30 that support the articles 60 from below. The transfer device 2 includes a supporting body 10 that supports an article 60 from below, and an advancing/retracting mechanism 20 that moves the supporting body 10 back and forth in a depth direction Y of the corresponding storage rack 3, and the article 60 is transferred using the supporting body 10 from the front side Y1 to the storage rack 3. Each rack body 30 has a separation space D (see FIG. 3), which will be described in detail later, and as a result of the supporting body 10 passing through the separation space D in a vertical direction Z in a state in which the supporting body 10 is projected to the back side Y2 of the storage rack 3 by the advancing/retracting mechanism 20, the article 60 is transferred between the supporting body 10 and the rack body 30 (see FIG. 6).

According to the present embodiment, the articles 60 are containers in which semiconductor wafers are housed, specifically, front opening unified pods (FOUPs). As denoted by virtual lines in FIG. 3, three recesses 70 are formed in the bottom 63 of each article 60. The three recesses 70 are formed at different positions in a circumferential direction with respect to the center of the bottom 63, extending in a groove shape in radial directions with respect to this center, when viewed in a plan view (when viewed in a vertical direction Z). In other words, the three recesses 70 are formed in the shape of a groove extending in a radial fashion with respect to the center of the bottom 63 when viewed in a plan view. Each of the three recesses 70 are formed such that the groove width is reduced toward the upper side. In other words, the recess 70 internally has inclined surfaces that are inclined toward the center of the groove (width directional center) as approaching the upper side. As will be described later, the rack body 30 includes first engaging parts 41 and a second engaging part 42 that engage with the corresponding recesses 70. When an article 60 is transferred from the supporting body 10 to the rack body 30, the first engaging parts 41 or the second engaging part 42 are/is guided by the inner surface of the recess 70, so that the position of the article 60 with respect to the rack body 30 can be corrected. Furthermore, as will be described later, the supporting body 10 includes third engaging parts 43 that engage with the recesses 70. When an article 60 is transferred from the rack body 30 to the supporting body 10, the third engaging parts 43 are guided by the inner surfaces of the recesses 70, so that the position of the article 60 with respect to the supporting body 10 can be corrected.

Figure 3:
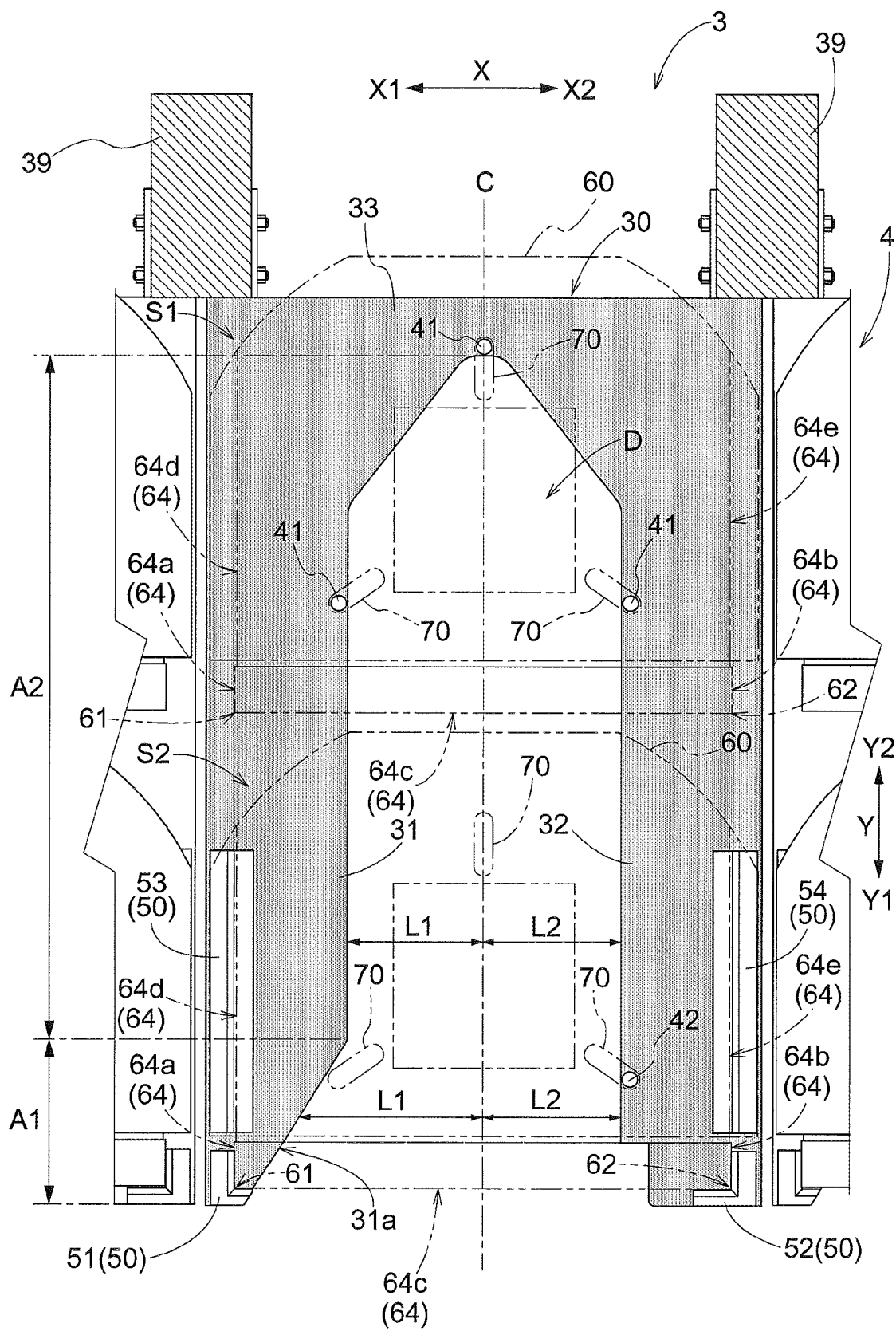
FIG. 3 is a plan view illustrating a rack body.
Figure 8:
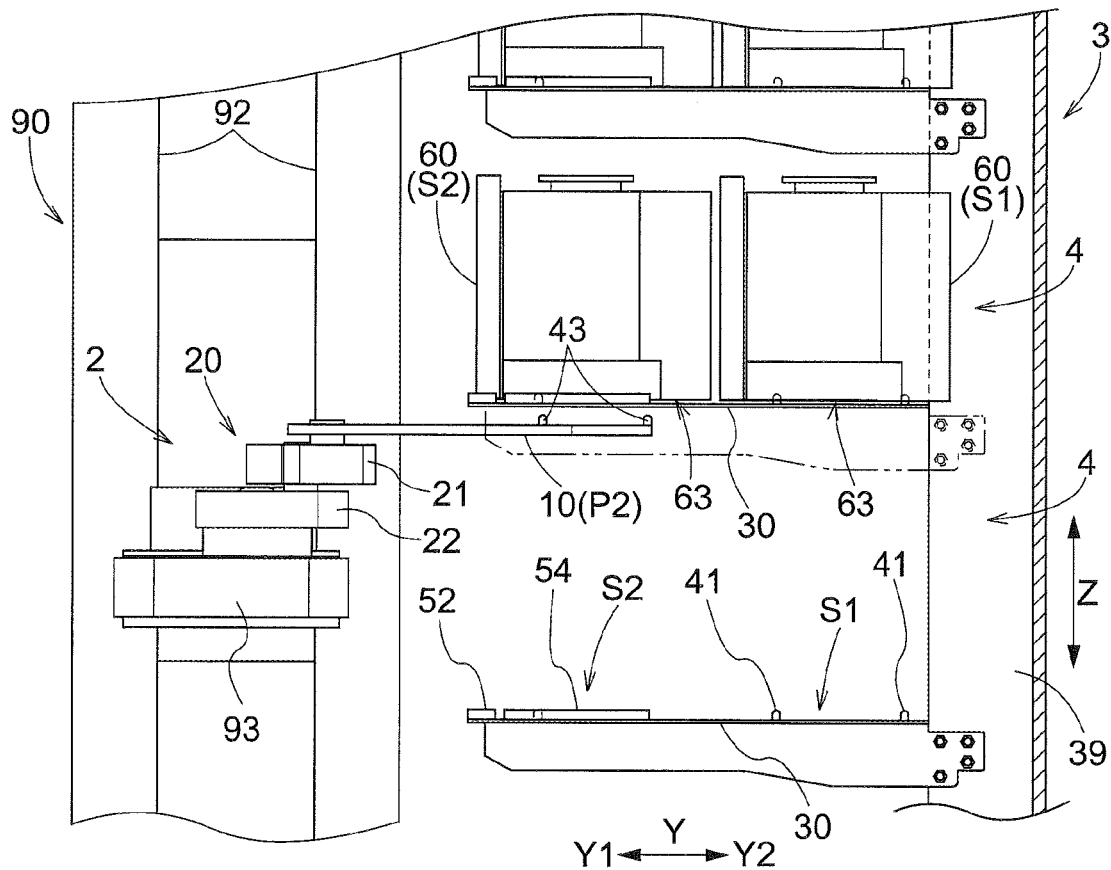
FIG. 8 is a side view illustrating the transfer device and the rack body in a state in which the supporting body is located at a second projected position.

Each rack body 30 is configured to be able to support, from below, a plurality of articles 60 aligned in the depth direction Y. As shown in FIGS. 1, 3, and 8, in the present embodiment, one rack body 30 is configured to be able to support, from below, two articles 60 aligned in the depth direction Y. Note that, in FIG. 3, for ease of understanding the configuration of the rack body 30, one rack body 30 is emphatically hatched and the articles 60 supported by this one rack body 30 are indicated by virtual lines. The storage rack 3 is provided with supporting members 39 that support the rack bodies 30. The rack bodies 30 are supported by the supporting members 39 in a cantilever manner from the back side Y2. In the present embodiment, the supporting members 39 are supporting posts that stand on the floor while extending in the vertical direction Z, and as shown in FIG. 1, the plurality of supporting members 39 are aligned in a lateral width direction X. Each of the rack bodies 30 is supported by two supporting members 39 aligned in the lateral width direction X.

As shown in FIGS. 3 and 8, a storage place for an article 60 on the backmost side Y2, in the depth direction Y, of the rack body 30 is referred to as a "first storage place S1", and a storage place for an article 60 on the frontmost side Y1, in the depth direction Y, of the rack body 30 is referred to as a "second storage place S2". In the present embodiment, the first storage place S1 is the storage place on the back side Y2 of the two storage places adjacent to each other in the depth direction Y, and the second storage place S2 is the storage place on the front side Y1. The articles 60 are supported on the rack body 30 in the same orientation at both the first storage place S1 and the second storage place S2. Specifically, as shown in FIG. 3, the articles 60 are supported on the rack body 30 in an orientation such that two of the three recesses 70 are aligned in the lateral width direction X at the same level in the depth direction Y, and the remaining recess 70 is arranged on the back side Y2 relative to the two recesses 70. Note that the lateral width direction X is a direction that is orthogonal to the depth direction Y in a horizontal plane.

Figure 2:
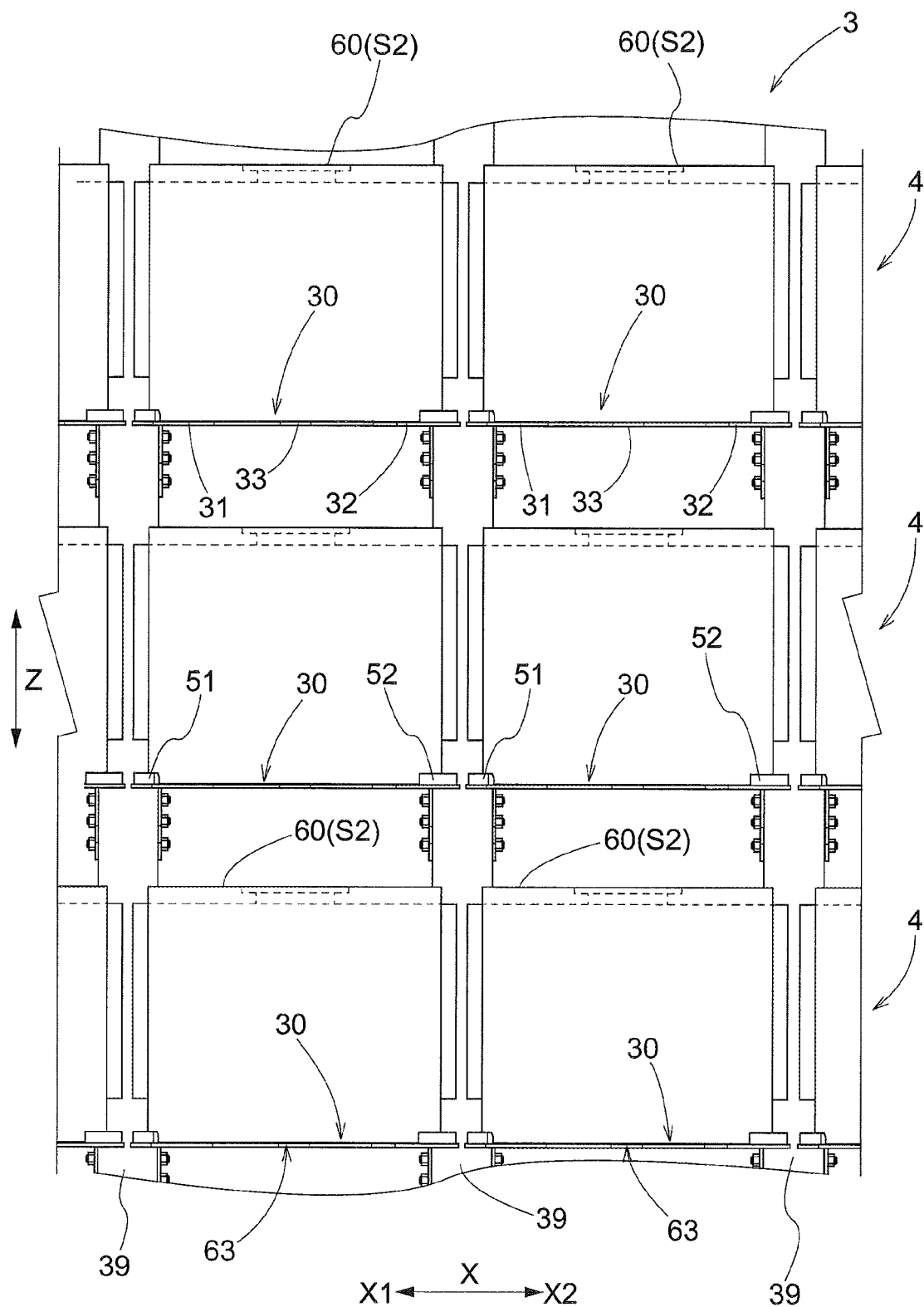
FIG. 2 is a front view illustrating part of a storage rack.

As shown in FIGS. 1 and 2, in the present embodiment, the storage rack 3 includes the plurality of rack bodies 30 that are aligned in the lateral width direction X at the same height (that is, at the same level in the vertical direction Z). The plurality of rack bodies 30 aligned in the lateral width direction X at the same height constitute a rack unit 4 capable of supporting a plurality of articles 60 aligned in the lateral width direction X. Furthermore, in the present embodiment, the plurality of rack bodies 30 of the storage rack 3 are aligned in the vertical direction Z at the same level in the lateral width direction X. Here, the storage rack 3 includes the rack units 4 in a plurality of stages in the vertical direction Z, and is configured to be able to support articles 60 on each of the plurality of stages (rack stages) aligned in the vertical direction Z. Furthermore, in the present embodiment, one pair of storage racks 3 are provided facing each other in the depth direction Y with a movement pathway R interposed therebetween.

Figure 7:
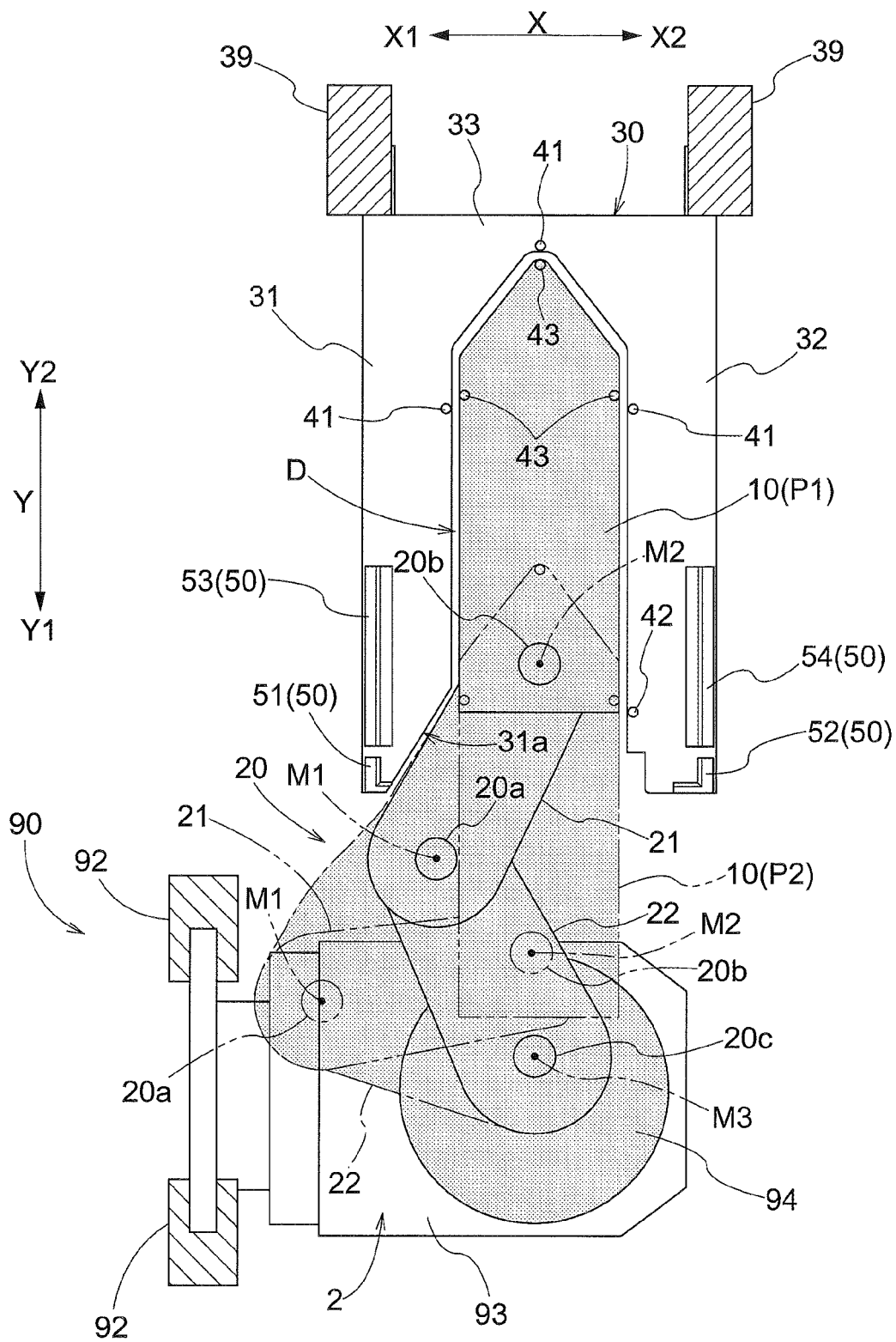
FIG. 7 is a diagram illustrating a trajectory of movement of the supporting body and an advancing/retracting mechanism.
Figure 9:
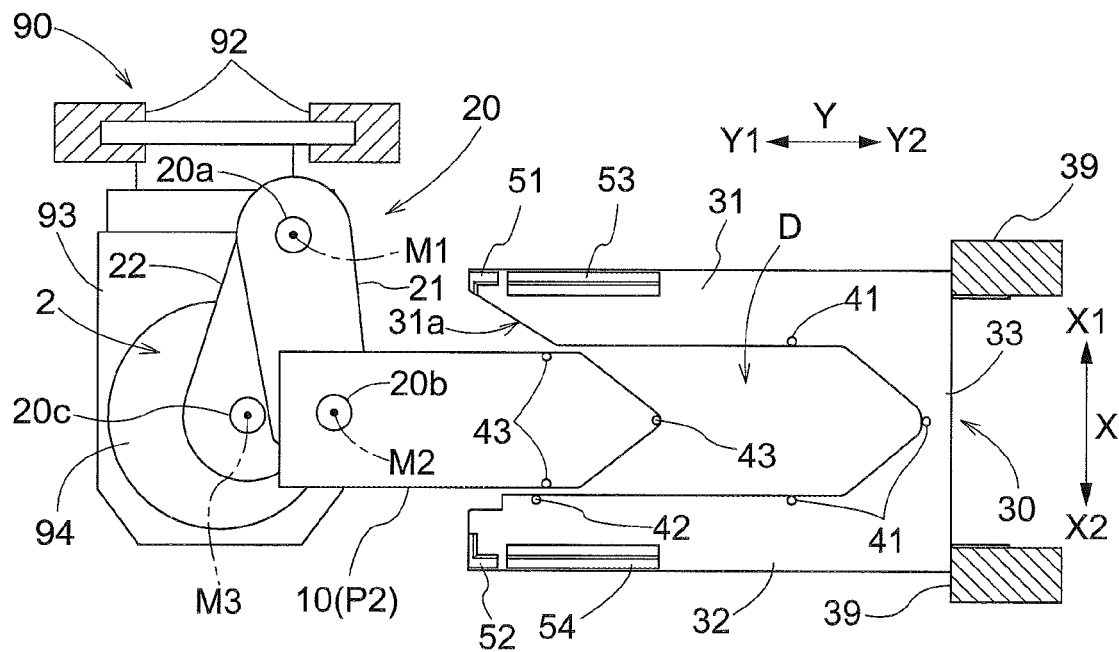
FIG. 9 is a plan view illustrating the transfer device and the rack body in the state in which the supporting body is located at the second projected position.
Figure 10:
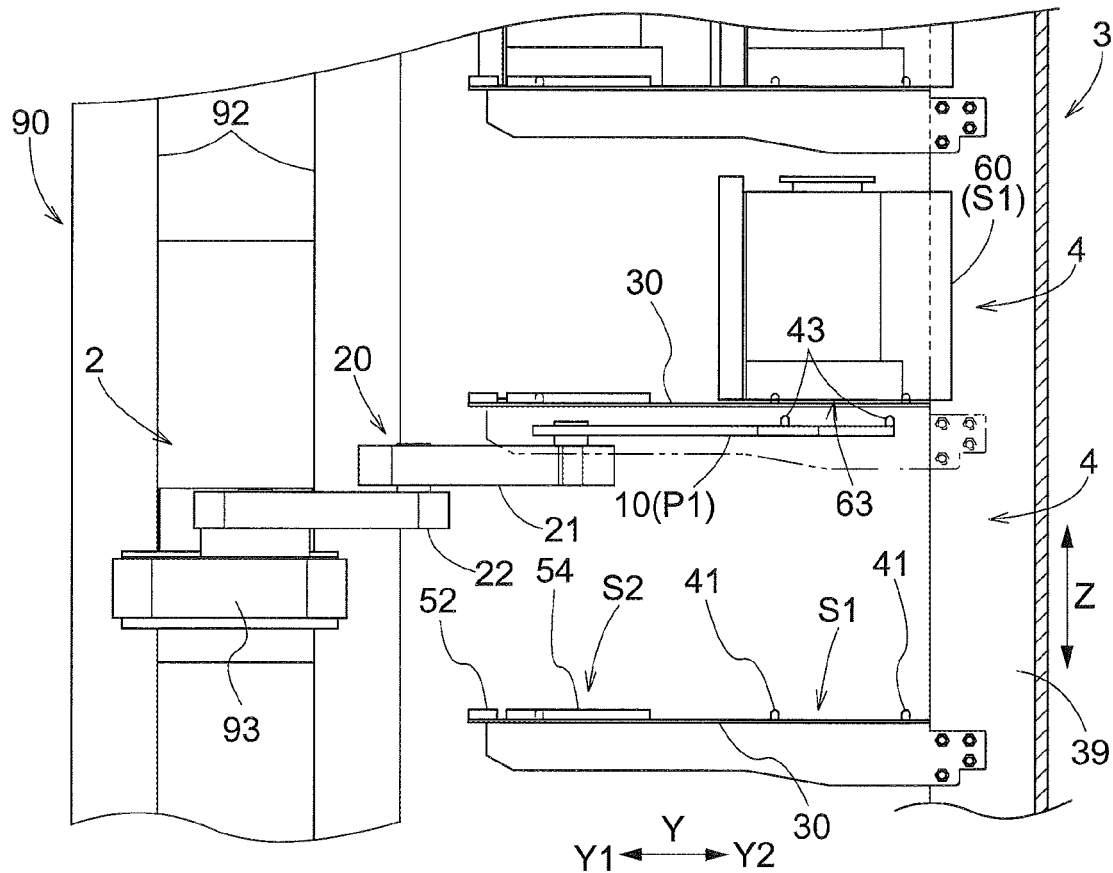
FIG. 10 is a side view illustrating the transfer device and the rack body in the state in which the supporting body is located at the first projected position.
Figure 11:
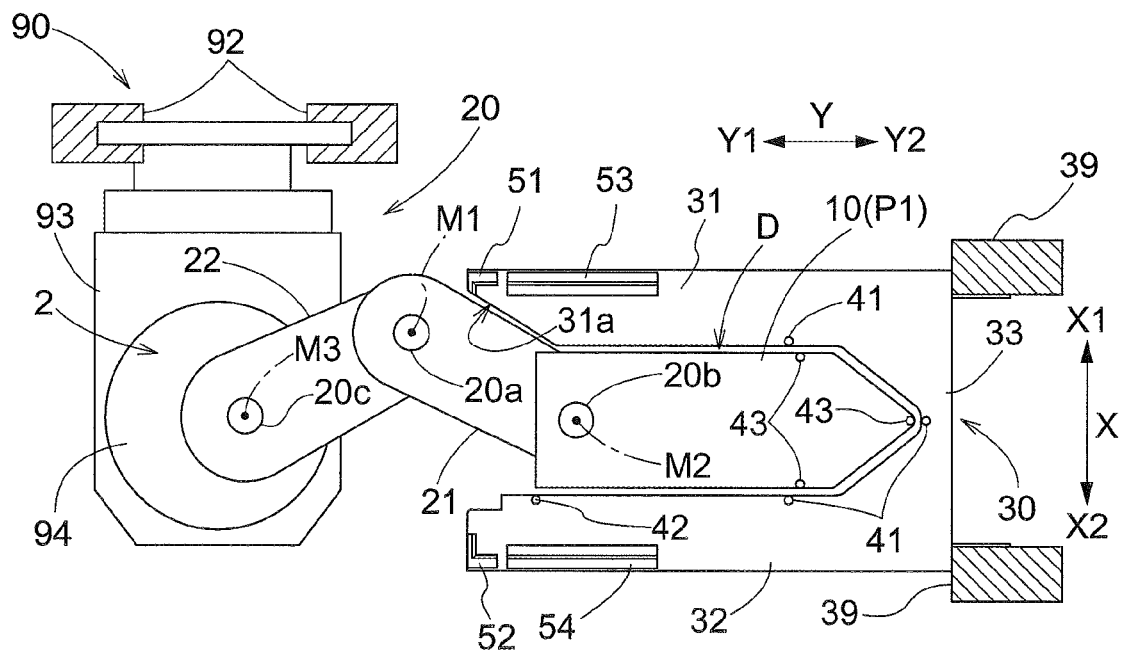
FIG. 11 is a plan view illustrating the transfer device and the rack body in the state in which the supporting body is located at the first projected position.

In the present embodiment, the supporting body 10 of the transfer device 2 is configured to support only one article 60 from below. Specifically, as shown in FIGS. 7 to 11, the supporting body 10 is provided with the third engaging parts 43 that engage with the recesses 70 of the article 60. The third engaging parts 43 are pins for positioning the article 60, and are formed protruding upward from a plate-shaped base of the supporting body 10. As described above, in the present embodiment, an article 60 has three recesses 70 on the bottom 63 thereof, and the supporting body 10 is provided with three third engaging parts 43. The article 60 is supported by the supporting body 10 in a state of being positioned with respect to the supporting body 10 by the third engaging parts 43 respectively engaging with the recesses 70. The three third engaging parts 43 are arranged on the supporting body 10 so as to be able to support the article 60 in the same orientation as that of when the article 60 is supported on the rack body 30. Specifically, as shown in FIGS. 7, 9, and 11, two of the three third engaging parts 43 are arranged while being aligned in the lateral width direction X at the same level in the depth direction Y, and the remaining third engaging part 43 is arranged on the back side Y2 relative to the two third engaging parts 43.

The advancing/retracting mechanism 20 of the transfer device 2 is configured to be able to move the supporting body 10 back and forth in the depth direction Y (advancing movement to the back side Y2 and retracting movement to the front side Y1) while maintaining the orientation of the supporting body 10. In other words, the advancing/retracting mechanism 20 is configured to be able to move the supporting body 10 in the depth direction Y while maintaining the orientation of the supporting body 10, between a retracted position P3 (see FIG. 1), at which the supporting body 10 is retracted to the side away from the rack body 30 (that is, to the front side Y1), and a projected position, at which the supporting body 10 is projected to the side approaching the rack body 30 (that is, to the back side Y2). As shown in FIGS. 10 and 11, when an article 60 is transferred between the supporting body 10 and the first storage place S1, the advancing/retracting mechanism 20 moves the supporting body 10 from the retracted position P3 to the first projected position P1, so that the supporting body 10 is located at the first projected position P1. Furthermore, as shown in FIGS. 8 and 9, when an article 60 is transferred between the supporting body 10 and the second storage place S2, the advancing/retracting mechanism 20 moves the supporting body 10 from the retracted position P3 to the second projected position P2, so that the supporting body 10 is located at the second projected position P2. Note that the first projected position P1 and the second projected position P2 are different positions in the depth direction Y, and the first projected position P1 is on the back side Y2 relative to the second projected position P2.

As shown in FIG. 1, the article storage facility 1 is provided with a transport device 90 that transports an article 60 to or from the storage rack 3. The transport device 90 transports an article 60 while moving in the lateral width direction X on the movement pathway R along the front sides of the storage racks 3. The movement pathway R is formed at a position adjacent to the front sides Y1 of the storage racks 3. In the present embodiment, the transport device 90 is a stacker crane. Specifically, the transport device 90 includes a traveling carriage 91 that is guided by a rail 95 installed on the floor and is capable of travelling in the lateral width direction X, and a vertically moving body 93 that is guided by masts 92 standing on the traveling carriage 91 and is capable of moving in the vertical direction Z (that is, capable of being lifted and lowered). The transfer device 2 is mounted on the transport device 90. In the present embodiment, the transfer device 2 is supported by the vertically moving body 93. Accordingly, the entire transfer device 2 moves in the vertical direction Z in accordance with the vertically moving body 93 being lifted or lowered.

Figure 6:
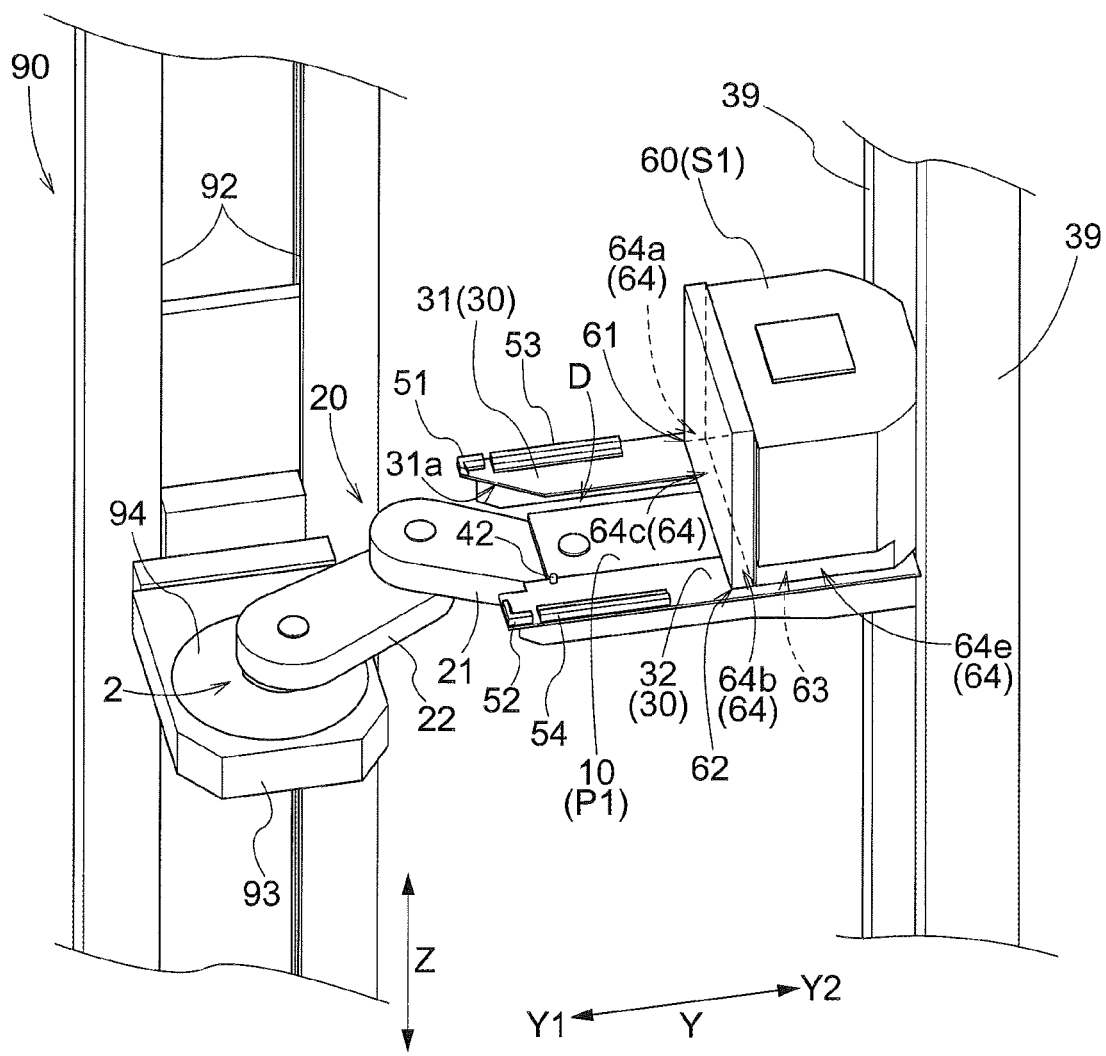
FIG. 6 is a perspective view illustrating a transfer device and the rack body in a state in which a supporting body is located at a first projected position.

In a state in which the vertically moving body 93 is lifted/lowered to the height that corresponds to a target rack body 30, an article 60 is transferred between the supporting body 10 and the rack body 30 using the transfer device 2. Specifically, by the supporting body 10 being projected toward the back side Y2 and in this state, the vertically moving body 93 being lifted/lowered, the supporting body 10 passes through the separation space D formed in the target rack body 30 in the vertical direction Z and the article 60 is transferred between the supporting body 10 and the rack body 30. That is, by lifting/lowering the vertically moving body 93 in a state in which the supporting body 10 is located at the first projected position P1, the article 60 is transferred between the supporting body 10 and the first storage place S1, and by lifting/lowering the vertically moving body 93 in a state in which the supporting body 10 is located at the second projected position P2, the article 60 is transferred between the supporting body 10 and the second storage place S2. As shown in FIG. 6, the vertically moving body 93 is provided with a rotating plate 94 that rotates the transfer device 2 around the axis thereof extending in the vertical direction Z with respect to the vertically moving body 93. Accordingly, the direction in which the supporting body 10 is projected by the advancing/retracting mechanism 20 can be switched by the rotating plate 94 rotating the transfer device 2, making it possible to transfer, using the supporting body 10, an article 60 with respect to any rack body 30 of the pair of storage racks 3.

In order to transport an article 60 from or to a storage rack 3, the transport device 90 is controlled by a control unit (not shown) of the article storage facility 1 to perform an operation for transferring the article 60 with respect to the storage rack 3. When an operation for transferring the article 60 to the storage rack 3 is performed, the traveling operation of the traveling carriage 91 is controlled so that it is moved to the position in the lateral width direction X that corresponds to the target rack body 30, and the lifting/lowering operation of the vertically moving body 93 is controlled so that the vertically moving body 93 is lifted/lowered to the height that corresponds to the rack body 30. Note that, while the traveling carriage 91 travels, the supporting body 10 is kept retracted at the retracted position P3 (see FIG. 1). The height that corresponds to the rack body 30 includes a lower-side height (the height of the vertically moving body 93 shown in FIGS. 8 and 10) and an upper-side height that is higher than the lower-side height. When the article 60 is transferred from the rack body 30 to the supporting body 10, the vertically moving body 93 is controlled to be lifted/lowered to the lower-side height of the rack body 30, and when the article 60 is transferred from the supporting body 10 to the rack body 30, the vertically moving body 93 is controlled to be lifted/lowered to the upper-side height of the rack body 30.

When the article 60 is transferred from the rack body 30 to the supporting body 10, the transfer operation of the transfer device 2 (operation of advancing/retracting the supporting body 10 using the advancing/retracting mechanism 20) and the lifting/lowering operation of the vertically moving body 93 are controlled so that the supporting body 10 is moved from the retracted position P3 to the first projected position P1 or the second projected position P2, then the vertically moving body 93 is lifted from the lower-side height to the upper-side height, and then the supporting body 10 is moved from the first projected position P1 or the second projected position P2 to the retracted position P3. Accordingly, the article 60 is caught by the supporting body 10 from the rack body 30, and the article 60 is transferred from the rack body 30 to the supporting body 10. Furthermore, when the article 60 is transferred from the supporting body 10 to the rack body 30, the transfer operation of the transfer device 2 and the lifting/lowering operation of the vertically moving body 93 are controlled so that the supporting body 10 is moved from the retracted position P3 to the first projected position P1 or the second projected position P2, then the vertically moving body 93 is lowered from the upper-side height to the lower-side height, and then the supporting body 10 is moved from the first projected position P1 or the second projected position P2 to the retracted position P3. Accordingly, the article 60 is unloaded from the supporting body 10 onto the rack body 30 and thus is transferred from the supporting body 10 to the rack body 30.

As shown in FIGS. 6 and 7, the advancing/retracting mechanism 20 is provided with a link mechanism that uses arms (links). Specifically, the advancing/retracting mechanism 20 includes a first arm 21, a second arm 22, a first coupling part 20a that couples the first arm 21 and the second arm 22, and a second coupling part 20b that couples the supporting body 10 and the first arm 21, and is provided at a position in the first arm 21 that is different from the position at which the first coupling part 20a is provided. The first coupling part 20a couples the first arm 21 and the second arm 22 so that they can rotate about a first axis M1 extending in the vertical direction Z, and the second coupling part 20b couples the supporting body 10 and the first arm 21 so that they can rotate about a second axis M2 extending in the vertical direction Z. The advancing/retracting mechanism 20 further includes a third coupling part 20c that couples the second arm 22 and another member and is provided at a position in the second arm 22 that is different from the first coupling part 20a. The third coupling part 20c couples the second arm 22 and the other member so that they can rotate about a third axis M3 extending in the vertical direction Z. In the present embodiment, the third coupling part 20c couples the second arm 22 and the vertically moving body 93 (specifically, here, the rotating plate 94 mounted on the vertically moving body 93). Note that the first axis M1, the second axis M2, and the third axis M3 are all virtual axes.

As shown in FIG. 7, assume that one side in the lateral width direction X is referred to as a "first side X1" and the other side in the lateral width direction X is referred to as a "second side X2", the transfer device 2 is configured to move the supporting body 10 back and forth with the first coupling part 20a located on the first side X1 relative to the second coupling part 20b, by rotating the first arm 21 and the second arm 22 about the first axis M1 in opposite directions. Note that, in FIG. 7, the supporting body 10 and the advancing/retracting mechanism 20 in a state in which the supporting body 10 is located at the first projected position P1 are denoted by solid lines, and the supporting body 10 and the advancing/retracting mechanism 20 in a state in which the supporting body 10 is located at the second projected position P2 are denoted by long-short-short dashed lines, and the trajectory of movement of the supporting body 10 and the advancing/retracting mechanism 20 when the supporting body 10 is moved between the first projected position P1 and the second projected position P2 is hatched. When the supporting body 10 is moved back and forth, the first arm 21 and the second arm 22 are rotated with the first coupling part 20a located on the first side X1 relative to the second coupling part 20b, and thus the trajectory of movement of the advancing/retracting mechanism 20 when the supporting body 10 is moved back and forth includes a portion protruded to the first side X1 from the trajectory of movement of the supporting body 10 when the supporting body 10 is moved back and forth. Also, when the supporting body 10 is moved between the second projected position P2 and the retracted position P3 (see FIG. 1), which is however omitted in FIG. 7, the first coupling part 20a is located on the first side X1 relative to the second coupling part 20b, similar to the case where the supporting body 10 is moved between the first projected position P1 and the second projected position P2.

The advancing/retracting mechanism 20 is provided with an interlocking mechanism for interlocking the arms (the first arm 21 and the second arm 22 in the present embodiment) and the supporting body 10, although the details are not included here. The interlocking mechanism is constituted by, for example, a plurality of rotating bodies (such as a pulley or a sprocket) and a power transmission (a belt, toothed belt, chain, or wire) that is wound spanning the plurality of rotating bodies to transmit the power. The transfer device 2 is provided with a driving power source such as an electrically-operated motor (not shown) that drives the second arm 22 to rotate about the third axis M3 with respect to the vertically moving body 93 (rotating plate 94). Also, when the second arm 22 is rotated about the third axis M3 with respect to the vertically moving body 93 (rotating plate 94), the interlocking mechanism causes the first arm 21 to rotate about the first axis M1 with respect to the second arm 22, and causes the supporting body 10 to rotate about the second axis M2 with respect to the first arm 21.

Assume that the direction and the angle of rotation of the second arm 22 about the third axis M3 with respect to the vertically moving body 93 are referred to as a "first rotation direction" and a "first rotation angle", the direction and the angle of rotation of the first arm 21 about the first axis M1 with respect to the second arm 22 are referred to as a "second rotation direction" and a "second rotation angle", and the direction and the angle of rotation of the supporting body 10 about the second axis M2 with respect to the first arm 21 are referred to as a "third rotation direction" and a "third rotation angle", and the interlocking mechanism has a configuration in which the second rotation direction is opposite to the first rotation direction, and the third rotation direction is identical to the first rotation direction, and the second rotation angle is twice as large as the first rotation angle, and the third rotation angle is identical to the first rotation angle. Accordingly, as shown in FIG. 7, the supporting body 10 is moved back and forth in the depth direction Y by the advancing/retracting mechanism 20, while maintaining its orientation.

As shown in FIGS. 7 and 11, in the present embodiment, in a state (specific state) in which the supporting body 10 is located at the first projected position P1, the first arm 21 is arranged inside the separation space D while being inclined toward the first side X1 as approaching the front side Y1, when viewed in a plan view. That is, in the specific state, the direction extending from the second axis M2 to the first axis M1 approximates to the direction to the first side X1 as approaching to the front side Y1, when viewed in a plan view. On the other hand, as shown in FIGS. 7 and 9, in the state in which the supporting body 10 is located at the second projected position P2, as in the state in which the supporting body 10 is located at the retracted position P3 (see FIG. 1), the first arm 21 is arranged outside the separation space D (on the front side Y1 relative to the separation space D), when viewed in a plan view.

The following will specifically describe the configuration of the rack body 30. As shown in FIG. 3, the rack body 30 includes a first supporting portion 31 and a second supporting portion 32. The first supporting portion 31 and the second supporting portion 32 are formed extending in the depth direction Y. The first supporting portion 31 is arranged on the first side X1 with respect to the width directional center C, which is the center in the lateral width direction X of the rack body 30, and the second supporting portion 32 is arranged on the second side X2 with respect to the width directional center C. The rack body 30 is configured to be able to support, on both sides in the lateral width direction X, a plurality of articles 60 (two articles 60 in the present embodiment) aligned in the depth direction Y, using the first supporting portion 31 and the second supporting portion 32.

The separation space D through which the supporting body 10 passes in the vertical direction Z when an article 60 is transferred is formed between the first supporting portion 31 and the second supporting portion 32. As shown in FIG. 7, the width, in the lateral width direction X, of the separation space D is larger than the width, in the lateral width direction X, of the supporting body 10. In the present embodiment, the supporting body 10 is formed such that the width, in the lateral width direction X, of the portion on the leading end side (back side Y2) is reduced toward the leading end side. Accordingly, the width, in the lateral width direction X, of the portion on the back side Y2 of the separation space D is reduced toward the back side Y2. Note that the supporting body 10 is formed in a shape such that it can pass through the separation space D in the vertical direction Z without interfering with the rack body 30, both in the state in which it is located at the first projected position P1 (see FIG. 11) and the state in which it is located at the second projected position P2 (see FIG. 9).

As shown in FIG. 3, the rack body 30 further includes a third supporting portion 33. The third supporting portion 33 is formed extending in the lateral width direction X, and is arranged on the back side Y2 relative to the separation space D. The third supporting portion 33 is arranged on the back side Y2 relative to the first supporting portion 31 and the second supporting portion 32, and the end, on the back side Y2, of the first supporting portion 31 and the end, on the back side Y2, of the second supporting portion 32 are coupled to each other by the third supporting portion 33. In other words, the rack body 30 is U-shaped (with the third supporting portion 33 serving as a bottom) and open to the front side Y1 when viewed in the vertical direction Z.

In view of downsizing of the article storage facility 1 in the depth direction Y and reducing time necessary for transferring an article 60 between the supporting body 10 and the rack body 30, it is desirable that the rack body 30 and the transfer device 2 can be arranged as close as possible to each other in the depth direction Y, on the condition that interference between the rack body 30 and the transfer device 2 can be avoided and articles 60 can appropriately be supported at all article storage places including the second storage place S2, which is an article storage place (storage place for an article 60) on the frontmost side Y1. The following describes a configuration of the rack body 30 used for a layout that satisfies such conditions and in which the rack body 30 and the transfer device 2 are arranged close to each other in the depth direction Y.

As shown in FIG. 3, the first distance L1 refers to a distance from the width directional center C to the first supporting portion 31 (the distance in the lateral width direction X, the same will also be applied to the description below), and the second distance L2 refers to a distance from the width directional center C to the second supporting portion 32. In other words, the first distance L1 is a distance from the width directional center C to the outer edge, on the width directional center C side (second side X2), of the first supporting portion 31, and the second distance L2 is a distance from the width directional center C to the outer edge, on the width directional center C side (first side X1) of the second supporting portion 32. In a first region A1 of the rack body 30, which is a region in the depth direction Y and includes the end portion on the front side Y1, the first distance L1 is longer than the second distance L2. Specifically, the portion of the first supporting portion 31 that is arranged in the first region A1 has a cut-off portion 31a obtained by cutting off a portion on the width directional center C side. In the present embodiment, the cut-off portion 31a is formed by cutting off a corner, on the second side X2, of the first supporting portion 31 at the end on the front side Y1 into a triangular shape. Here, the cut-off portion 31a is shaped such that the outer edge, on the width directional center C side, of the first supporting portion 31 in the first region A1 is straight to the first side X1 toward the front side Y1 at a constant rate. As a result of such a cut-off portion 31a being formed, the first distance L1 is longer than the second distance L2 in the first region A1. Note that, as shown in FIG. 3, in the present embodiment, the second supporting portion 32 has a cut-off portion obtained by cutting off a corner, on the first side X1, of the second supporting portion 32 at the end on the front side Y1 into a rectangular shape, and also in the region in the depth direction Y in which this cut-off portion is formed (that is included in the first region A1), the first distance L1 is longer than the second distance L2.

As shown in FIG. 7, with a configuration as described above in which the first distance L1 is longer than the second distance L2 in the first region A1, it is possible to arrange the rack body 30 and the transfer device 2 close to each other in the depth direction Y to the extent that the first arm 21 is arranged inside the separation space D in the specific state (in which the supporting body 10 is located at the first projected position P1), when viewed in a plan view. Thus, as a result of the first arm 21 being arranged inside the separation space D in such a specific state when viewed in a plan view, it is possible to move the supporting body 10 in the vertical direction Z so that the supporting body 10 passes through the separation space D while avoiding interference between the first arm 21 and the rack body 30, regardless of the positional relationship in the vertical direction Z between the first arm 21 and the rack body 30. Furthermore, as shown in FIG. 7, the rack body 30 is formed so as not to overlap, when viewed in a plan view, the trajectory of movement of the supporting body 10 and the advancing/retracting mechanism 20 when the supporting body 10 is moved back and forth. Accordingly, it is possible to move the supporting body 10 from the retracted position P3 to the first projected position P1, at which the first arm 21 is positioned inside the separation space D, when viewed in a plan view, while avoiding interference between the first arm 21 and the rack body 30, regardless of the positional relationship in the vertical direction Z between the first arm 21 and the rack body 30.

As described above, in the present embodiment, the first arm 21 is arranged inside the separation space D, in the specific state, while being inclined to the first side X1 as approaching the front side Y1, when viewed in a plan view. Accordingly, in the present embodiment, as shown in FIGS. 7 and 11, the outer edge, on the width directional center C side, of the first supporting portion 31 in the first region A1 has a shape that conforms to an outer edge of the first arm 21 in the specific state when viewed in a plan view. Accordingly, it is possible to ensure that an area of the first supporting portion 31 in the first region A1, when viewed in a plan view, is larger than in a case where the outer edge, on the width directional center C side, of the first supporting portion 31 in the first region A1 has a shape that does not conform to the outer edge of the first arm 21 in the specific state (for example, a case where the outer edge extends parallel to the depth direction Y), when viewed in a plan view. As a result, also at the second storage place S2, which is a storage place for an article 60 on the frontmost side Y1, it is easy to ensure appropriate strength of support of an article 60 by the first supporting portion 31.

On the other hand, according to the present embodiment, as shown in FIG. 3, in a second region A2, which is a region in the depth direction Y and is located on the back side Y2 relative to the first region A1, the first distance L1 is equal to the second distance L2. In the present embodiment, both the outer edge, on the width directional center C side, of the first supporting portion 31, and the outer edge, on the width directional center C side, of the second supporting portion 32 extend parallel to the depth direction Y, except for part of the second region A2 on the back side Y2. As a result, the first distance L1 and the second distance L2 have a certain value in the depth direction Y (that is, the same value at every position in the depth direction Y), except for part of the second region A2 on the back side Y2. Note that a configuration is also possible in which portions of the first supporting portion 31 and the second supporting portion 32 that are arranged in the second region A2 have a cut-off portion obtained by cutting off part on the width directional center C side or a protruding portion that protrudes to the width directional center C side. Furthermore, in the present embodiment, the entire region in which the first supporting portion 31 and the second supporting portion 32 are arranged in the depth direction Y, and that is on the back side Y2 relative to the first region A1 serves as the second region A2 in which the first distance L1 is equal to the second distance L2. Note that a configuration is also possible in which part of the region in which the first supporting portion 31 and the second supporting portion 32 are arranged in the depth direction Y, and that is on the back side Y2 relative to the first region A1 serves as the second region A2 in which the first distance L1 is equal to the second distance L2, and the remaining region is such that the first distance L1 is different from the second distance L2.

The following will describe a structure for positioning articles 60 at the first storage place S1 and the second storage place S2. As shown in FIG. 3, the first supporting portion 31, the second supporting portion 32, and the third supporting portion 33 are respectively provided with the first engaging parts 41 that engage with the recesses 70 of the article 60 that is stored at the first storage place S1. Here, each of the first supporting portion 31, the second supporting portion 32, and the third supporting portion 33 is provided with one first engaging part 41. The first engaging parts 41 are pins for positioning an article 60, and are formed protruding upward from a plate-shaped base of the rack body 30. The article 60 is supported at the first storage place S1 on the rack body 30, in a state in which it is positioned with respect to the rack body 30 as a result of the first engaging parts 41 engaging with the recesses 70.

As described above, in the present embodiment, the article 60 is supported on the rack body 30 in an orientation such that two of the three recesses 70 are aligned in the lateral width direction X at the same level in the depth direction Y, and the remaining one recess 70 is arranged on the back side Y2 relative to the two recesses 70. Accordingly, the first engaging part 41 formed on the first supporting portion 31 and the first engaging part 41 formed on the second supporting portion 32 are arranged at the same level in the depth direction Y. Since the third supporting portion 33 is arranged on the back side Y2 relative to the first supporting portion 31 and the second supporting portion 32, the first engaging part 41 formed on the third supporting portion 33 is arranged on the back side Y2 relative to the first engaging parts 41 formed on the first supporting portion 31 and the second supporting portion 32. The first engaging part 41 formed on the third supporting portion 33 is arranged at the width directional center C.

As described above, the article 60 is supported at the first storage place S1 on the rack body 30 in a state in which it is positioned with respect to the rack body 30 using the three first engaging parts 41. Note that the present invention may employ a configuration in which the bottom 63 of the article 60 supported at the first storage place S1 on the rack body 30 is in contact with the upper surface of the plate-shaped base of the rack body 30, or a configuration in which the bottom 63 of the article 60 supported at the first storage place S1 on the rack body 30 is not in contact with the upper surface of the plate-shaped base of the rack body 30 (for example, a configuration in which only the three first engaging parts 41 are in contact with the bottom 63 of the article 60). Furthermore, in the latter configuration or the like, another member provided on the rack body 30 may also be in contact with the bottom 63 of the article 60 supported at the first storage place S1 on the rack body 30. Examples of such another member can include a grommet (elastic member with a venthole) used to supply an inert gas to the inside of the container (FOUP in the present embodiment) serving as an article 60.

In the present embodiment, the rack body 30 is provided with the second engaging part 42 that engages with the corresponding recess 70 of an article 60 that is stored at the second storage place S2. As shown in FIG. 3, since the article 60 stored at the second storage place S2 is supported by the first supporting portion 31 and the second supporting portion 32, either or both of the first supporting portion 31 and the second supporting portion 32 is/are provided with the second engaging part 42. As described above, the first supporting portion 31 has the cut-off portion 31a, and thus, in the present embodiment, as shown in FIG. 3, the article 60 stored at the second storage place S2 is supported on the rack body 30 so that a recess 70 does not overlap the first supporting portion 31 when viewed in a plan view. Accordingly, in the present embodiment, only one of the first supporting portion 31 and the second supporting portion 32, namely, the second supporting portion 32, is provided with the second engaging part 42. Similar to the first engaging parts 41, the second engaging part 42 is a pin for positioning an article 60, and is formed protruding upward from the plate-shaped base of the rack body 30.

The rack body 30 further includes restricting parts 50 that are arranged opposing side faces 64 (see FIGS. 3 and 6) of the bottom 63 of an article 60 stored at the second storage place S2, and restrict horizontal movement of the article 60. In this context, the expression that two faces (a first face and a second face) "oppose" each other means that a normal vector directed outward of the first face has a component opposite to that of a normal vector directed outward of the second face, and includes not only a case where the first face and the second face are arranged parallel to each other, but also a case where the first face and the second face are arranged while being inclined with respect to each other. Since the rack body 30 includes such restricting parts 50, the article 60 is supported at the second storage place S2 on the rack body 30 in a state in which it is positioned with respect to the rack body 30 by the second engaging part 42 and the restricting parts 50. Note that the present invention may employ a configuration in which the bottom 63 of the article 60 supported at the second storage place S2 on the rack body 30 is in contact with the upper surface of the plate-shaped base of the rack body 30, or a configuration in which the bottom 63 of the article 60 supported at the second storage place S2 on the rack body 30 is not in contact with the upper surface of the plate-shaped base of the rack body 30 (for example, a configuration in which only the second engaging part 42 and the restricting parts 50 are in contact with the bottom 63 of the article 60). Furthermore, in the latter configuration or the like, another member (such as an above-described grommet) provided on the rack body 30 may also be in contact with the bottom 63 of the article 60 supported at the second storage place S2 on the rack body 30.

As shown in FIG. 6, the bottom 63 of an article 60 has a first corner 61 and a second corner 62 that are each formed by two side faces 64 that intersect with each other. Accordingly, in the present embodiment, as shown in FIGS. 3 and 6, the article 60 is stored at the second storage place S2 in the orientation such that one of the two side faces 64 forming the first corner 61 is directed to the front side Y1 and the other one is directed to the first side X1, and one of the two side faces 64 forming the second corner 62 is directed to the front side Y1 and the other one is directed to the second side X2. Note that, as described above, the article 60 is stored at the first storage place S1 in the same orientation as in the case where it is stored at the second storage place S2.

Specifically, as shown in FIGS. 3 and 6, the side faces 64 of the bottom 63 of the article 60 include a first side face 64a, a second side face 64b, a third side face 64c, a fourth side face 64d, and a fifth side face 64e. Also, the first corner 61 is formed by the first side face 64a and the third side face 64c that intersect with each other (at a right angel, here), and the second corner 62 is formed by the second side face 64b and the third side face 64c that intersect with each other (at a right angel, here). The article 60 is stored at the second storage place S2 in an orientation such that the first side face 64a is directed to the first side X1, the second side face 64b is directed to the second side X2, and the third side face 64c is directed to the front side Y1. The first side face 64a, the second side face 64b, the third side face 64c, the fourth side face 64d, and the fifth side face 64e are each planar. Also, in the state in which the article 60 is stored at the second storage place S2, the first side face 64a, the second side face 64b, the fourth side face 64d, and the fifth side face 64e are arranged along a surface orthogonal to the lateral width direction X, and the third side face 64c is arranged along a surface orthogonal to the depth direction Y. Note that the fourth side face 64d is a face that is directed to the same side as that of the first side face 64a, and is arranged on the back side Y2 relative to the first side face 64a in the state in which the article 60 is stored at the second storage place S2. Furthermore, the fifth side face 64e is a face that is directed to the same side as that of the second side face 64b, and is arranged on the back side Y2 relative to the second side face 64b in a state in which the article 60 is stored at the second storage place S2.

Figure 4:
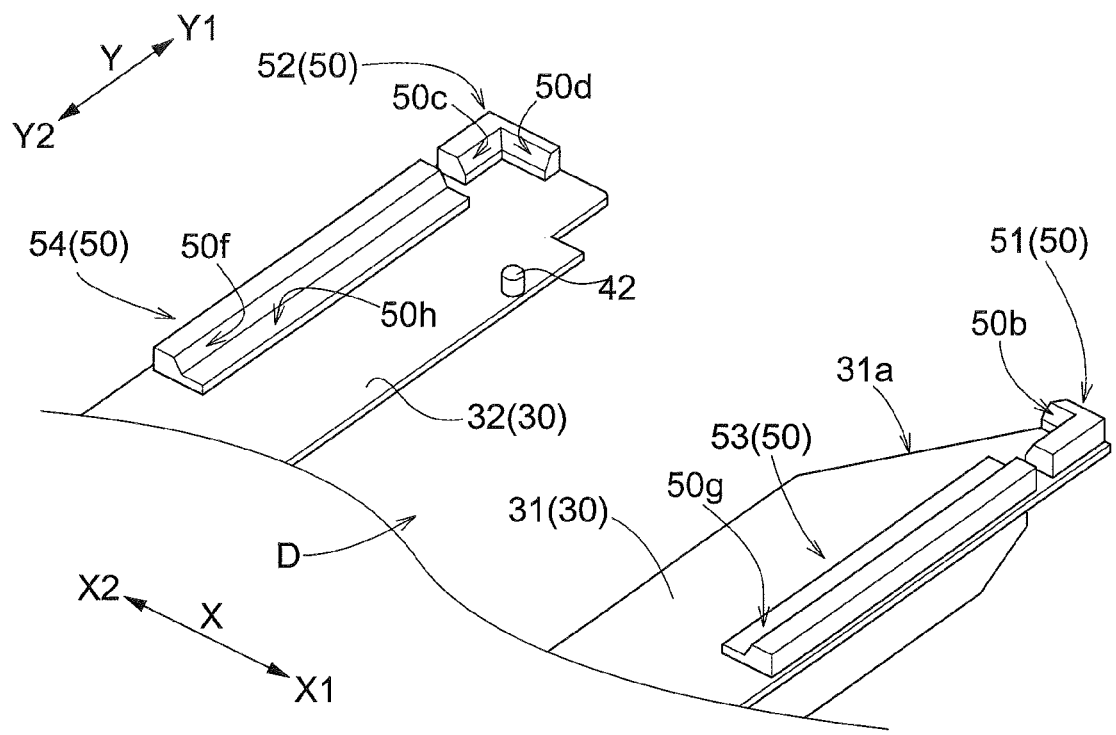
FIG. 4 is a perspective view illustrating part of the rack body.
Figure 5:
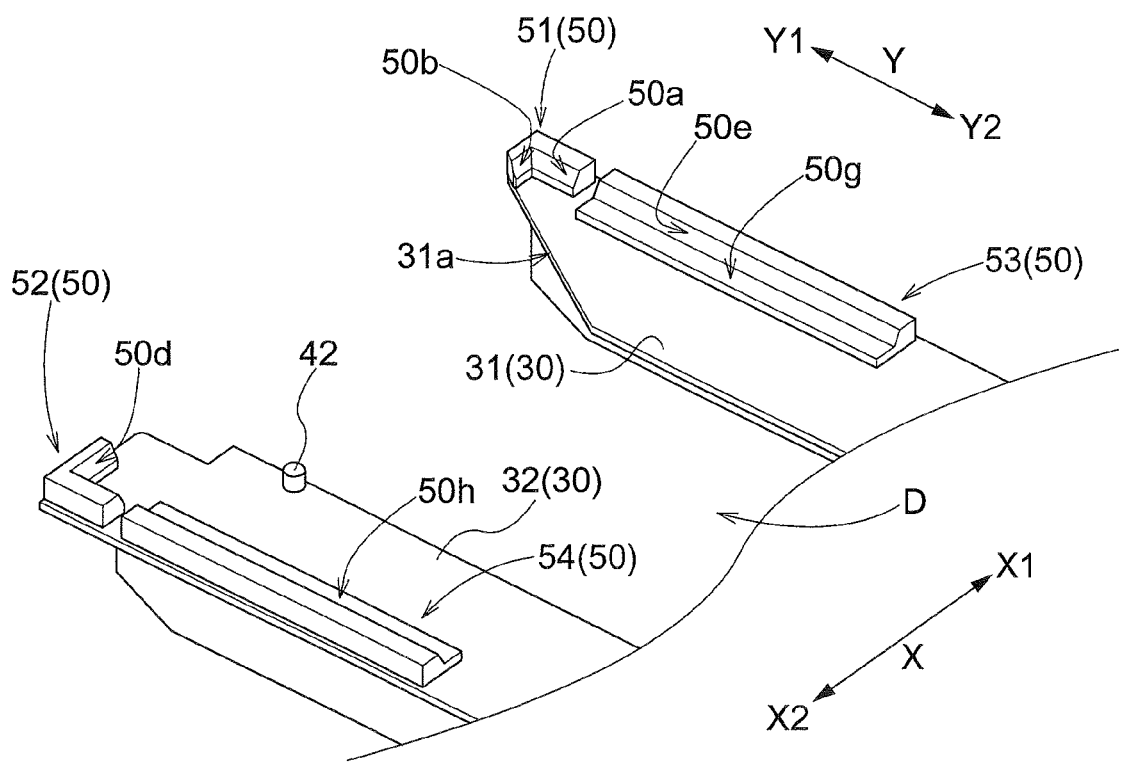
FIG. 5 is a perspective view illustrating the part of the rack body.

As shown in FIGS. 3 to 5, each of the first supporting portion 31 and the second supporting portion 32 is provided with the restricting parts 50. Specifically, the first supporting portion 31 is provided with two restricting parts 50, namely, a first restricting part S1 and a third restricting part 53, and the second supporting portion 32 is provided with two restricting parts 50, namely, a second restricting part 52 and a fourth restricting part 54. In the present embodiment, the restricting parts 50 are constituted by members (block-shaped members) other than the plate-shaped base of the rack body 30, and are fixed to the base from above.

The first restricting part 51 has two restricting surfaces (50a and 50b) arranged opposing the two side faces 64 (64a and 64c) forming the first corner 61 in the state in which the article 60 is stored at the second storage place S2. Specifically, as shown in FIG. 5, the first restricting part 51 has a first restricting surface 50a arranged opposing the first side face 64a, and a second restricting surface 50b arranged opposing the third side face 64c. The first restricting surface 50a restricts movement of the first corner 61 to the first side X1, and the second restricting surface 50b restricts movement of the first corner 61 to the front side Y1. In the present embodiment, the first restricting surface 50a has an inclined surface that is inclined downward as approaching the second side X2, and the second restricting surface 50b has an inclined surface that is inclined downward as approaching the back side Y2. Accordingly, the first restricting surface 50a restricts movement of the first corner 61 to the first side X1 by guiding the first corner 61 toward the second side X2, and the second restricting surface 50b restricts movement of the first corner 61 to the front side Y1 by guiding the first corner 61 toward the back side Y2.

The second restricting part 52 has two restricting surfaces (50*c* and 50*d*) arranged opposing the two side faces 64 (64*b* and 64*c*) forming the second corner 62 in the state in which the article 60 is stored at the second storage place S2. Specifically, as shown in FIG. 4, the second restricting part 52 has a third restricting surface 50*c* arranged opposing the second side face 64*b*, and a fourth restricting surface 50*d* arranged opposing the third side face 64*c*. The third restricting surface 50*c* restricts movement of the second corner 62 to the second side X2, and the fourth restricting surface 50*d* restricts movement of the second corner 62 to the front side Y1. In the present embodiment, the third restricting surface 50*c* has an inclined surface that is inclined downward as approaching the first side X1, and the fourth restricting surface 50*d* has an inclined surface that is inclined downward as approaching the back side Y2. Accordingly, the third restricting surface 50*c* restricts movement of the second corner 62 to the second side X2 by guiding the second corner 62 toward the first side X1, and the fourth restricting surface 50*d* restricts movement of the second corner 62 to the front side Y1 by guiding the second corner 62 toward the back side Y2.

As shown in FIG. 5, the third restricting part 53 has a fifth restricting surface 50*e* arranged opposing the fourth side face 64*d* in the state in which the article 60 is stored at the second storage place S2. The fifth restricting surface 50*e* restricts movement of the fourth side face 64*d* to the first side X1. In the present embodiment, the fifth restricting surface 50*e* has an inclined surface that is inclined downward as approaching the second side X2, and restricts movement of the fourth side face 64*d* to the first side X1 by guiding the fourth side face 64*d* toward the second side X2. In the present embodiment, the third restricting part 53 has a first supporting surface 50*g* that supports the article 60 stored at the second storage place S2 from below, but a configuration without such a first supporting surface 50*g* is also possible.

As shown in FIG. 4, the fourth restricting part 54 has a sixth restricting surface 50*f* arranged opposing the fifth side face 64*e* in the state in which the article 60 is stored at the second storage place S2. The sixth restricting surface 50*f* restricts movement of the fifth side face 64*e* to the second side X2. In the present embodiment, the sixth restricting surface 50*f* has an inclined surface that is inclined downward as approaching the first side X1, and restricts movement of the fifth side face 64*e* to the second side X2 by guiding the fifth side face 64*e* toward the first side X1. In the present embodiment, the fourth restricting part 54 has a second supporting surface 50*h* that supports the article 60 stored at the second storage place S2 from below, but a configuration without such a second supporting surface 50*h* is also possible.

Since the rack body 30 includes the restricting parts 50 having the above-described configuration, it is possible to correct a misalignment, in the lateral width direction X, of an article 60 that is stored at the second storage place S2 using the first restricting surface 50*a*, the third restricting surface 50*c*, the fifth restricting surface 50*e*, and the sixth restricting surface 50*f*, and hold the article 60 at the corrected position in the lateral width direction X, using these restricting surfaces (50*a*, 50*c*, 50*e*, and 50*f*). Furthermore, it is possible to correct a misalignment, in the depth direction Y, of an article 60 that is stored at the second storage place S2 (here, a misalignment to the front side Y1) using the second restricting surface 50*b* and the fourth restricting surface 50*d*, and hold the article 60 at the corrected position in the depth direction Y using these restricting surfaces (50*b* and 50*d*) (while restricting movement to the front side Y1, here). As described above, in the present embodiment, the rack body 30 (specifically, the second supporting portion 32) has the second engaging part 42 that engages with the corresponding recess 70 of the article 60 that is stored at the second storage place S2. Accordingly, in the present embodiment, by using the second engaging part 42 and the restricting parts 50 together, a misalignment of an article 60 that is stored at the second storage place S2 is corrected and the article 60 is held at the corrected position. Note that, in the present embodiment, as shown in FIGS. 4 and 5, the first restricting surface 50*a*, the second restricting surface 50*b*, the third restricting surface 50*c*, and the fourth restricting surface 50*d* may each have a vertical surface below the above-described inclined surface, and these vertical surfaces may also oppose the side faces 64 of the bottom 63 of the article 60 in the state in which the article 60 is supported at the second storage place S2 on the rack body 30.

Other Embodiments

The following will describe other embodiments of the article storage facility.

(1) The above-described embodiment has described, as an example, a configuration in which the first supporting portion 31 has two restricting parts 50, namely, the first restricting part 51 and third restricting part 53, and the second supporting portion 32 has two restricting parts 50, namely, the second restricting part 52 and the fourth restricting part 54. However, the present invention is not limited to this, and a configuration is also possible in which, for example, the first supporting portion 31 has only one of the first restricting part 51 and the third restricting part 53, namely, the first restricting part 51, and the second supporting portion 32 has only one of the second restricting part 52 and the fourth restricting part 54, namely, the second restricting part 52.

(2) The above-described embodiment has described, as an example, a configuration in which an article 60 is stored at the second storage place S2 in an orientation such that one of the two side faces 64 forming the first corner 61 is directed to the front side Y1 and the other one is directed to the first side X1, and one of the two side faces 64 forming the second corner 62 is directed to the front side Y1 and the other one is directed to the second side X2. However, the present invention is not limited to this, and a configuration is also possible in which, for example, an article 60 is stored at the second storage place S2 in an orientation such that one of the two side faces 64 forming the first corner 61 is directed to the back side Y2 and the other one is directed to the second side X2, and one of the two side faces 64 forming the second corner 62 is directed to the back side Y2 and the other one is directed to the first side X1 (that is, the orientation of the article 60 in the above-described embodiment is rotated about the axis along the vertical direction Z by 180 degrees). Even in this case, it is preferable that the rack body 30 has a restricting part 50 that has two restricting surfaces arranged opposing the two side faces 64 forming the first corner 61, and a restricting part 50 that has two restricting surfaces arranged opposing the two side faces 64 forming the second corner 62.

(3) The above-described embodiment has described, as an example, a configuration in which only one of the first supporting portion 31 and the second supporting portion 32, namely, the second supporting portion 32, has the second engaging part 42. However, the present invention is not limited to this, and a configuration is also possible in which, if an article 60 stored at the second storage place S2 is supported on the rack body 30 such that its recess 70 overlaps with the first supporting portion 31 when viewed in a plan view, both of the first supporting portion 31 and the second supporting portion 32 may have the second engaging part 42, or only one of the first supporting portion 31 and the second supporting portion 32, namely, the first supporting portion 31, may have the second engaging part 42. Furthermore, it is also possible that the rack body 30 does not have the second engaging part 42, and in this case, it is also possible that, for example, an article 60 is positioned at the second storage place S2 only by the restricting parts 50.

(4) The above-described embodiment has described, as an example, a configuration in which the outer edge, on the width directional center C side, of the first supporting portion 31 in the first region A1 has a shape that conforms to an outer edge of the first arm 21 in the specific state, when viewed in a plan view. However, the present invention is not limited to this, and a configuration is also possible in which the outer edge, on the width directional center C side, of the first supporting portion 31 in the first region A1 has a shape that does not conform to the outer edge of the first arm 21 in the specific state, when viewed in a plan view (for example, a configuration in which the outer edge extends parallel to the depth direction Y).

(5) The above-described embodiment has described, as an example, a configuration in which, in a state in which the supporting body 10 is positioned at the first projected position P1 (specific state), the first arm 21 is arranged inside the separation space D while being inclined toward the first side X1 as approaching the front side Y1, when viewed in a plan view. However, the present invention is not limited to this, and a configuration is also possible in which, in the specific state, the first arm 21 is arranged inside the separation space D while extending parallel to the depth direction Y, when viewed in a plan view. In other words, in the specific state, the direction connecting the first axis M1 and the second axis M2 may also be parallel to the depth direction Y when viewed in a plan view. In this case, for example, the outer edge, on the width directional center C side, of the first supporting portion 31 in the first region A1 may have a shape that conforms to, when viewed in a plan view, an outer edge of the first arm 21 in a state in which the supporting body 10 is positioned on the front side Y1 relative to the first projected position P1, or may have a shape that conforms to an outer edge of the trajectory of the movement of the first arm 21.

(6) The above-described embodiment has described, as an example, a configuration in which the third coupling part 20c couples the second arm 22 to the vertically moving body 93 (specifically, the rotating plate 94 provided on the vertically moving body 93). However, the present invention is not limited to this, and a configuration is also possible in which the advancing/retracting mechanism 20 includes at least three arms including the first arm 21 and the second arm 22, and the third coupling part 20c couples the second arm 22, to an arm coupled to the vertically moving body 93 directly or via another arm.

(7) The above-described embodiment has described, as an example, a configuration in which the supporting body 10 supports only one article 60 from below. However, the present invention is not limited to this, and a configuration is also possible in which the supporting body 10 can support a plurality of articles 60 (for example, two articles 60) aligned in the depth direction Y from below. In this case, both transfer of one of the articles 60 between the supporting body 10 and the first storage place S1, and transfer of the other one of the articles 60 between the supporting body 10 and the second storage place S2 can be realized by the supporting body 10 projected to the first projected position P1 passing through the separation space D in the vertical direction Z.

(8) The above-described embodiment has described, as an example, a configuration in which, in the second region A2, which is a region in the depth direction Y and is located on the back side Y2 relative to the first region A1, the first distance L1 is equal to the second distance L2. However, the present invention is not limited to this, and a configuration is also possible in which, in the second region A2, the first distance L1 differs from the second distance L2 (for example, the first distance L1 is longer than the second distance L2).

(9) The above-described embodiment has described, as an example, a configuration in which a rack body 30 can support two articles 60 aligned in the depth direction Y from below. However, the present invention is not limited to this, and a configuration is also possible in which the rack body 30 can support at least three articles 60 aligned in the depth direction Y. In this case, in contrast to the above-described embodiment, one or more other storage places (storage places for articles 60) are arranged in the depth direction Y between the first storage place S1 and the second storage place S2.

(10) The above-described embodiment has described, as an example, a configuration in which a storage rack 3 includes a plurality of rack bodies 30 aligned in the lateral width direction X at the same height. However, the present invention is not limited to this, and a configuration is also possible in which the storage rack 3 includes only one rack body 30 at a single position in the vertical direction Z. Furthermore, the above-described embodiment has described, as an example, a configuration in which the storage rack 3 includes a plurality of rack bodies 30 aligned in the vertical direction Z at the same level in the lateral width direction X. However, the present invention is not limited to this, and a configuration is also possible in which the storage rack 3 includes only one rack body 30 at a single position in the lateral width direction X.

(11) The above-described embodiment has described, as an example, a configuration in which a pair of storage racks 3 are disposed opposing each other in the depth direction Y with the movement pathway R interposed therebetween. However, the present invention is not limited to this, and a configuration is also possible in which one storage rack 3 is disposed on only one side, in the depth direction Y, of the movement pathway R (on one side, in the width direction, of the movement pathway R). In this case, the vertically moving body 93 may also not be provided with the rotating plate 94.

(12) The above-described embodiment has described, as an example, a configuration in which the supporting members 39 that support the rack bodies 30 are supporting posts that stand on the floor. However, the present invention is not limited to this, and a configuration is also possible in which the supporting members 39 are supporting frames fixed to the floor or ceiling, walls fixed to the floor, or the like.

(13) The above-described embodiment has described, as an example, a configuration in which the transfer device 2 is supported by the vertically moving body 93, and moves the supporting body 10 in the vertical direction Z so that it passes through the separation space D, by lifting and lowering the vertically moving body 93 and moving the entire transfer device 2 in the vertical direction Z. However, the present invention is not limited to this, and a configuration is also possible in which the transfer device 2 is provided with a lifting/lowering mechanism for moving the supporting body 10 in the vertical direction Z, and uses the lifting/lowering mechanism to move the supporting body 10 in the vertical direction Z so that it passes through the separation space D.

(14) The above-described embodiment has described, as an example, a configuration in which the transport device 90 is a stacker crane. However, the present invention is not limited to this, and a configuration is also possible in which the transport device 90 is a transport device other than the stacker crane, such as a transport device that travels autonomously on the floor while recognizing its current location, a transport device that travels along the movement pathway R that is provided in the lateral width direction X correspondingly to each stage of the storage rack 3, or a transport device (ceiling transport vehicle) that is supported by a rail provided on the ceiling side and travels while being guided by the rail.

(15) The above-described embodiment has described, as an example, a configuration in which an article 60 is a FOUP in which semiconductor wafers are housed. However, the present invention is not limited to this, and a configuration is also possible in which the article 60 is a container in which objects other than semiconductor wafers are housed, such as a container in which reticles are housed. Furthermore, the article 60 may also be an article other than a container.

(16) The above-described embodiment has described, as an example, a configuration in which each of the first supporting portion 31, the second supporting portion 32, and the third supporting portion 33 is provided with the first engaging part 41. However, the present invention is not limited to this, and a configuration is also possible in which only some of the first supporting portion 31, the second supporting portion 32, and the third supporting portion 33 (for example, only the first supporting portion 31 and the second supporting portion 32) are provided with the first engaging part 41. In such a case, at least one of the first supporting portion 31, the second supporting portion 32, and the third supporting portion 33 may also be provided with restricting parts (similar to the restricting parts 50 of the above-described embodiment) that are arranged opposing side faces 64 of the bottom 63 of an article 60 stored at the first storage place S1, and restrict horizontal movement of the article 60.

(17) The above-described embodiment has described, as an example, a configuration in which each of the first supporting portion 31 and the second supporting portion 32 is provided with the restricting parts 50. However, the present invention is not limited to this, and a configuration is also possible in which at least one of the first supporting portion 31 and the second supporting portion 32 is not provided with such restricting parts 50.

(18) The above-described embodiment has described, as an example, a configuration in which a rack body 30 is provided with the third supporting portion 33. However, the present invention is not limited to this, and a configuration is also possible in which the rack body 30 is not provided with the third supporting portion 33, that is, a configuration in which the end, on the back side Y2, of the first supporting portion 31 and the end, on the back side Y2, of the second supporting portion 32 are not coupled to each other.

(19) The above-described embodiment has described, as an example, a configuration in which the storage racks 3 are provided for the articles 60 (storage objects) that each have, at a plurality of positions on the bottom 63 thereof, positioning recesses 70 that are recessed upward. However, the present invention is not limited to this, and a configuration is also possible in which the storage racks 3 are provided for articles 60 that each have, at only one position on the bottom 63 thereof, a positioning recess 70 that is recessed upward, or articles 60 that have no positioning recess 70 that is recessed upward on the bottoms 63 thereof.

(20) Note that the configurations disclosed in the foregoing embodiments can also be applied in combination with a configuration disclosed in the other embodiments unless they contradict each other (including combinations of the embodiments explained as other embodiments). With respect to other configurations, the embodiments disclosed in the present description are merely examples in all respects. Therefore, a variety of modifications are possible as appropriate within the scope without departing from the spirit of the present disclosure.

Overview of Embodiments

The overview of the foregoing article storage facility will be described.

An article storage facility includes: a storage rack configured to store at least one article; and a transfer device configured to transfer the article to the storage rack from a front side of the storage rack; wherein the storage rack includes a rack body configured to support the article from below, assuming that, in a horizontal plane, a direction that is orthogonal to a depth direction of the storage rack is a lateral width direction, and one side in the lateral width direction is a first side, and the other side in the lateral width direction is a second side, the rack body includes, on the first side with respect to a width directional center, a first supporting portion that is formed extending in the depth direction, and, on the second side with respect to the width directional center, a second supporting portion that is formed extending in the depth direction, the width directional center being the center in the lateral width direction of the rack body, and the rack body being able to support, on both sides in the lateral width direction, a plurality of articles aligned in the depth direction using the first supporting portion and the second supporting portion, and the transfer device includes a supporting body configured to support an article from below, and an advancing/retracting mechanism configured to move the supporting body back and forth in the depth direction, the article being transferred between the supporting body and the rack body, by the supporting body being projected toward a back side of the storage rack by the advancing/retracting mechanism, and in this state, the supporting body passing through a separation space formed between the first supporting portion and the second supporting portion in a vertical direction, the advancing/retracting mechanism includes: a first arm; a second arm; a first coupling part that couples the first arm and the second arm so that they can rotate about a first axis that extends in the vertical direction; and a second coupling part that couples the supporting body and the first arm so that they can rotate about a second axis that extends in the vertical direction, the second coupling part being provided at a position in the first arm that is different from a position at which the first coupling part is provided, the transfer device is configured to move the supporting body back and forth with the first coupling part located on the first side relative to the second coupling part, by rotating the first arm and the second arm about the first axis in opposite directions, and in a first region, which is a region in the depth direction and includes an end on the front side of the rack body, a distance from the width directional center to the first supporting portion is longer than a distance from the width directional center to the second supporting portion.

With the above-described configuration, a trajectory of movement of the advancing/retracting mechanism when the supporting body is moved back and forth is a trajectory that protrudes, to the first side, from a trajectory of movement of the supporting body, due to the fact that the first coupling part is located on the first side relative to the second coupling part. In this regard, with the above-described configuration, the rack body is formed such that, in the first region, which is a region in the depth direction and includes an end on the front side of the rack body, a distance from the width directional center, which is the center in the lateral width direction of the rack body, to the first supporting portion (hereinafter, referred to as a "first distance") is longer than a distance from the width directional center to the second supporting portion (hereinafter, referred to as a "second distance"). Accordingly, in the first region, the first distance being longer than the second distance makes it possible to enlarge the separation space formed between the first supporting portion and the second supporting portion toward the first side. Since the separation space can be enlarged to the first side in the first region in this manner, it is easy to arrange the rack body and the transfer device close to each other in the depth direction while avoiding interference between the rack body and the trajectory of movement of the advancing/retracting mechanism, compared to a case where the first distance is equal to the second distance in the first region. As a result, it is possible to realize an article storage facility that uses the advancing/retracting mechanism configured to move back and forth the supporting body that supports an article, by rotating the plurality of arms rotatable coupled to each other, and in which the distance, in the depth direction, between the storage rack and the transfer device can be reduced.

Here, preferably, when the transfer device transfers an article between the supporting body and a specific storage place, which is an article storage place on the backmost side in the depth direction of the rack body, the advancing/retracting mechanism projects the supporting body to a specific position in the depth direction, in a specific state in which the supporting body is located at the specific position, the first arm is arranged inside the separation space while being inclined toward the first side as approaching the front side when viewed in the vertical direction, and an outer edge, on the width directional center side, of the first supporting portion in the first region has a shape that conforms to an outer edge of the first arm in the specific state when viewed in the vertical direction.

With this configuration, it is possible to arrange the rack body and the transfer device close to each other in the depth direction to the extent that, in the specific state, the first arm is arranged inside the separation space when viewed in the vertical direction. Moreover, according to the above-described configuration, since the outer edge, on the width directional side, of the first supporting portion in the first region has a shape that conforms to an outer edge of the first arm in the specific state when viewed in the vertical direction, it is possible to configure such that, in the specific state, the first arm is arranged inside the separation space when viewed in the vertical direction, and to ensure such an area, when viewed in the vertical direction, of the first supporting portion in the first region that the appropriate strength of support of an article by the first supporting portion can be ensured.

Furthermore, preferably, in a second region, which is a region in the depth direction and is located on the back side relative to the first region, the distance from the width directional center to the first supporting portion is equal to the distance from the width directional center to the second supporting portion.

With this configuration, since a larger area, when viewed in the vertical direction, of the first supporting portion can be ensured than in a case where, in the second region, the first distance (distance from the width directional center to the first supporting portion) is longer than second distance (distance from the width directional center to the second supporting portion), it is easy to ensure appropriate strength of support of an article by the first supporting portion.

It is sufficient that the article storage facility according to this disclosure can realize at least one of the above-described effects.

The invention claimed is:

1. An article storage facility comprising:
a storage rack configured to store at least one article; and
a transfer device configured to transfer an article of the at least one article to the storage rack from a front side of the storage rack;
wherein the storage rack includes a rack body configured to support an article from below,
wherein, in a horizontal plane, a direction that is orthogonal to a depth direction of the storage rack is a lateral width direction, and one side in the lateral width direction is a first side, and the other side in the lateral width direction is a second side, the rack body includes, on the first side with respect to a width directional center, a first supporting portion that is formed extending in the depth direction, and, on the second side with respect to the width directional center, a second supporting portion that is formed extending in the depth direction, the width directional center being the center in the lateral width direction of the rack body, and the rack body being able to support, on both sides in the lateral width direction, the at least one article aligned in the depth direction using the first supporting portion and the second supporting portion,
wherein the transfer device includes a supporting body configured to support an article from below, and an advancing/retracting mechanism configured to move the supporting body back and forth in the depth direction, an article being transferred between the supporting body and the rack body, by the supporting body being projected toward a back side of the storage rack by the advancing/retracting mechanism, and in this state, the supporting body passing through a separation space formed between the first supporting portion and the second supporting portion in a vertical direction,
wherein the advancing/retracting mechanism includes:
a first arm;
a second arm;
a first coupling part that couples the first arm and the second arm so that they can rotate about a first axis that extends in the vertical direction; and
a second coupling part that couples the supporting body and the first arm so that they can rotate about a second axis that extends in the vertical direction, the second coupling part being provided at a position in the first arm that is different from a position at which the first coupling part is provided,
wherein the transfer device is configured to move the supporting body back and forth with the first coupling part located on the first side relative to the second coupling part, by rotating the first arm and the second arm about the first axis in opposite directions, wherein in a first region, which is a region in the depth direction and includes an end on the front side of the rack body, a distance from the width directional center to the first supporting portion is longer than a distance from the width directional center to the second supporting portion, wherein an opening between the first supporting portion and the second supporting portion in the first region is wider in the lateral width direction than an opening between the first supporting portion and the second supporting portion in a region in the depth direction on the back side relative to the first region, and wherein the depth direction is a direction in which the at least one article is transferred to the storage rack.

2. The article storage facility according to claim 1, wherein, when the transfer device transfers an article between the supporting body and a specific storage place, which is an article storage place on the backmost side in the depth direction of the rack body, the advancing/retracting mechanism projects the supporting body to a specific position in the depth direction, wherein in a specific state in which the supporting body is located at the specific position, the first arm is arranged inside the separation space while being inclined toward the first side as approaching the front side when viewed in the vertical direction, and wherein an outer edge, on the width directional center side, of the first supporting portion in the first region has a shape that conforms to an outer edge of the first arm in the specific state when viewed in the vertical direction.

3. The article storage facility according to claim 1, wherein, in a second region, which is a region in the depth direction and is located on the back side relative to the first region, the distance from the width directional center to the first supporting portion is equal to the distance from the width directional center to the second supporting portion.

* * * * *